United States Patent
Nakaya et al.

(10) Patent No.: US 8,883,257 B2
(45) Date of Patent: Nov. 11, 2014

(54) METHOD FOR MANUFACTURING GAS BARRIER THIN FILM-COATED PLASTIC CONTAINER

(75) Inventors: Masaki Nakaya, Chuo-ku (JP); Mari Shimizu, Chuo-ku (JP)

(73) Assignee: Kirin Beer Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/264,079

(22) PCT Filed: Jun. 25, 2009

(86) PCT No.: PCT/JP2009/061582
§ 371 (c)(1),
(2), (4) Date: Oct. 12, 2011

(87) PCT Pub. No.: WO2010/119578
PCT Pub. Date: Oct. 21, 2010

(65) Prior Publication Data
US 2012/0052215 A1 Mar. 1, 2012

(30) Foreign Application Priority Data
Apr. 13, 2009 (JP) ................................. 2009-097494

(51) Int. Cl.
| | | |
|---|---|---|
| *H05H 1/24* | (2006.01) | |
| *H01J 37/32* | (2006.01) | |
| *C23C 16/505* | (2006.01) | |
| *B65D 23/02* | (2006.01) | |
| *C23C 16/04* | (2006.01) | |
| *B65D 1/02* | (2006.01) | |
| *C23C 16/26* | (2006.01) | |

(52) U.S. Cl.
CPC ............ *B65D 23/02* (2013.01); *H01J 37/32568* (2013.01); *H01J 2237/332* (2013.01); *C23C 16/505* (2013.01); *C23C 16/045* (2013.01); *B65D 1/0215* (2013.01); *H01J 37/32541* (2013.01); *C23C 16/26* (2013.01)
USPC ... 427/237; 427/238; 427/255.28; 427/249.1; 427/249.15; 427/250; 427/487; 427/488; 427/489; 427/490; 427/491; 427/509; 427/553; 427/569; 427/576; 427/577; 427/578; 427/579

(58) Field of Classification Search
USPC ............ 427/230–239, 255.28, 249.1, 249.15, 427/250, 487–491, 509, 553, 569, 576, 577, 427/578, 579
See application file for complete search history.

(56) References Cited

U.S. PATENT DOCUMENTS

| | | | | |
|---|---|---|---|---|
| 5,798,139 | A | * | 8/1998 | Nagashima et al. .......... 427/237 |
| 5,849,366 | A | * | 12/1998 | Plester ......................... 427/491 |
| 6,294,226 | B1 | | 9/2001 | Shimamura |
| 2006/0051539 | A1 | * | 3/2006 | Yamasaki et al. ............ 428/35.7 |
| 2010/0112252 | A1 | | 5/2010 | Ito et al. |

FOREIGN PATENT DOCUMENTS

| | | |
|---|---|---|
| EP | 0 773 167 A1 | 5/1997 |
| EP | 1 010 773 A1 | 6/2000 |
| JP | 2788412 B2 | 8/1998 |
| JP | 3072269 B2 | 7/2000 |
| JP | 2005-281844 A | 10/2005 |
| JP | 2008-88471 A | 4/2008 |
| JP | 2008-88472 A | 4/2008 |
| KR | 10-2010-0014717 A | 2/2010 |
| WO | WO 96/05112 A1 | 2/1996 |
| WO | WO 98/37259 A1 | 8/1998 |
| WO | WO 2008/041386 A1 | 4/2008 |

OTHER PUBLICATIONS

International Preliminary Report on Patentability mailed Oct. 27, 2011 for counterpart application PCT/JP2009/061582.
Korean Office Action in corresponding Application No. 10-2011-7026912 dated May 22, 2013.

* cited by examiner

*Primary Examiner* — William Phillip Fletcher, III
(74) *Attorney, Agent, or Firm* — Sughrue Mion, PLLC

(57) ABSTRACT

Disclosed herein is a method for producing a plastic container coated with a thin film that is excellent in gas barrier properties, film coloration and film adhesiveness without using an external electrode having a special shape while suppressing deposition of foreign matters such as carbon powders. The method for producing a gas barrier thin film-coated plastic container according to the present invention includes the steps of: housing a plastic container in an external electrode serving as a film-forming unit; placing an internal electrode serving as a raw material gas supply tube in an inside of the plastic container; exhausting gas from an inside of the external electrode by activating a vacuum pump; blowing a raw material gas into the inside of the plastic container under a reduced pressure; and forming a gas barrier thin film on an inner wall surface of the plastic container by generating plasma from the raw material gas, setting a power source frequency of a power source for plasma generation to supply power to the external electrode to be 5.5 to 6.5 MHz.

8 Claims, 8 Drawing Sheets

METHOD FOR MANUFACTURING GAS BARRIER THIN FILM-COATED PLASTIC CONTAINER

CROSS REFERENCE TO RELATED APPLICATIONS

This application is a National Stage of International Application No. PCT/JP2009/061582 filed on Jun. 25, 2009, which claims priority from Japanese Patent Application No. 2009-097494, filed on Apr. 13, 2009, the contents of all of which are incorporated herein by reference in their entirety.

FIELD OF THE INVENTION

The present invention relates to a method for producing a gas barrier thin film-coated plastic container by forming a gas barrier thin film on the inner wall surface of a plastic container by a plasma CVD (chemical vapor deposition) method. The container is used to pack, for example, drinks or foodstuffs, and the ability thereof to store drinks or foodstuffs is improved.

BACKGROUND ART

Plastic containers are easy to adsorb and absorb odor and are inferior in gas barrier properties to bottles or cans, and therefore it has been difficult to use plastic containers for storing drinks sensitive to oxygen such as beer and sparkling liquor. In order to overcome drawbacks of plastic containers such as strong adsorption and absorption properties and low gas barrier property, a method and apparatus for coating a plastic container with, for example, a hard carbon film (diamond-like carbon (DLC)) and the like is disclosed. For example, an apparatus for coating the inner wall surface of a container with a hard carbon film is disclosed which uses an external electrode having an internal space whose shape is substantially similar to the outer shape of a container to be coated and an internal electrode adapted to be inserted into the inside of the container through the mouth of the container and also serving as a raw material gas introduction tube (see, for example, Patent Document 1 or 2). Such an apparatus is used by applying high-frequency power to the external electrode in a state that a carbon source gas such as carbons of an aliphatic hydrocarbons or an aromatic hydrocarbons is supplied into the container as a raw material gas. At this time, plasma is generated from the raw material gas between the external electrode and the internal electrode. Ions in the generated plasma are attracted by a high-frequency-derived potential difference (self-bias) generated between the external electrode and the internal electrode and impinge on the inner wall of the container so that a film is formed. Here, as a power source for plasma generation, one with an industrial frequency of 13.56 MHz which is easy to use and easily available is used in a conventional apparatus for mass production.

Meanwhile, a technique for suppressing the generation of plasma in an exhaust chamber of the apparatus or in an exhaust path downstream from the exhaust chamber to prevent the generation of carbon-based foreign matters is disclosed (see, for example, Patent Document 3). According to this technique, a spacer made of a dielectric material is provided in a gap between the inner wall surface of the external electrode and the outer wall surface of the plastic container to adjust the total capacitance of the apparatus, and low-frequency power of 400 kHz to 4 MHz is supplied to the external electrode. Another technique is disclosed (see, for example, Patent Document 4), according to which a vacuum chamber obtained by replacing the upper part of the external electrode with a dielectric material is used to adjust the total capacitance of the apparatus and low-frequency power of 400 kHz to 4 MHz is supplied to the external electrode.

Further, a technique for suppressing the formation of an excess thin film on the mouth of a container is disclosed (see, for example, Patent Document 5). According to this technique, the length of a discharge plasma sheath and the radius of the mouth of a container are set so that a predetermined relationship can be maintained between them and a low-frequency power source of 0.1 to 5 MHz is used.

PRIOR ART DOCUMENTS

Patent Documents

Patent Document 1: Japanese Patent No. 2788412
Patent Document 2: Japanese Patent No. 3072269
Patent Document 3: Japanese Patent Application Laid-Open (JP-A) No. 2008-088471
Patent Document 4: JP-A No. 2008-088472
Patent Document 5: JP-A No. 2005-281844

SUMMARY OF THE INVENTION

Problems to be Solved by the Invention

In formation of a gas barrier thin film on a container, as the properties of the container, mainly gas barrier properties, film coloration and film adhesiveness are required, and from the viewpoint of enhancing production efficiency, mainly reduced processing time and operation stability are also required.

As described in Patent Documents 3 and 4, when the frequency of the power source for plasma generation is as high as 13.56 MHz generally used, deposition of foreign matters such as carbon powders in an exhaust system tends to be promoted. In order to suppress the deposition, a power source with a frequency lower than 13.56 MHz is used.

However, as a result of investigations made by the present inventors, it has been found that when the frequency of the power source for plasma generation of the standard-type film-forming apparatus disclosed in Patent Document 1 or 2 is set to a value as low as 1 to 3 MHz, problems such as degradation of gas barrier properties and darker coloration occur. Further, the invention disclosed in Patent Document 5 imposes design limitations on the shape of the mouth (especially, on the diameter of the mouth) of a container.

Therefore, an object of the present invention is to produce a plastic container coated with a thin film that is excellent in gas barrier properties, film coloration (properties in terms of the small difference in the coloration density of film from area to area in the container (i.e., the degree of color unevenness is small) and the lowness of the coloration density), and film adhesiveness without using an external electrode having a special shape while suppressing the deposition of foreign matters such as carbon powders. It is to be noted that the foreign matters deposited in an exhaust chamber etc. are carbon powders or carbon dusts (also simply referred to as "dust").

Means for Solving the Problems

In order to achieve the above object, the present inventors have intensively studied, and as a result have found that by setting the frequency of the power source for plasma generation to 5.5 to 6.5 MHz, coating with a thin film that is excellent in all of gas barrier properties, film coloration and film adhesiveness while the deposition of foreign matters is specifically suppressed can be achieved. This finding has led to the completion of the present invention. That is, a method for producing a gas barrier thin film-coated plastic container according the present invention is characterized by including the steps of: housing a plastic container in an external electrode serving as a film-forming unit; placing an internal electrode serving as a raw material gas supply tube in an inside of the plastic container; exhausting gas from an inside of the external electrode by activating a vacuum pump; blowing a raw material gas into the inside of the plastic container under a reduced pressure; and forming a gas barrier thin film on an inner wall surface of the plastic container by generating plasma from the raw material gas, setting a power source frequency of a power source for plasma generation to supply power to the external electrode to be 5.5 to 6.5 MHz.

In the method for producing a gas barrier thin film-coated plastic container according to the present invention, in the step of housing a plastic container in an external electrode, the plastic container is preferably housed in the external electrode in a state that a mouth of the container is directed downward.

This makes it possible to easily remove foreign matters that have entered the internal space of the container before film formation, thereby preventing the occurrence of coating defects during film formation. Further, it is also possible to prevent reattaching of substances derived from the raw material gas for forming a thin film to the bottle at the end of film formation.

In the method for producing a gas barrier thin film-coated plastic container according to the present invention, in the step of placing an internal electrode serving as a raw material gas supply tube in an inside of the plastic container, when a height of the container is defined as "h" and a bottom of the container is defined as a reference point, the raw material gas supply tube is inserted from the mouth of the container so that a distal end of the raw material gas supply tube is preferably located at a position of ½·h or higher and ⅔·h or lower.

In the method for producing a gas barrier thin film-coated plastic container according to the present invention, a configuration using the external electrode that has an internal space having a cylindrical shape with bottom is included.

In the method for producing a gas barrier thin film-coated plastic container according to the present invention, as the gas barrier thin film, a configuration forming a carbon film, a silicon-containing carbon film or a metal oxide film, as the gas barrier thin film, is included.

In the method for producing a gas barrier thin film-coated plastic container according to the present invention, a configuration in which the plastic container is a container having a capacity of 500 mL or more is included.

In the method for producing a gas barrier thin film-coated plastic container according to the present invention, a configuration in which the plastic container is a container made of polyethylene terephthalate is included.

Effects of the Invention

According to the present invention, it is possible to produce a plastic container coated with a thin film that is excellent in gas barrier properties, film coloration and film adhesiveness without using an external electrode having a special shape while suppressing the deposition of foreign matters such as carbon powders.

BEST MODE FOR CARRYING OUT THE INVENTION

Hereinbelow, the present invention will be described in detail with reference to an embodiment, but the description is not intended to be construed in a limiting sense. Various changes may be made to the embodiment without impairing the effects of the present invention.

First, a film-forming apparatus for use in a method for producing a gas barrier thin film-coated plastic container according to an embodiment of the present invention will be described. A usable film-forming apparatus is one identical with, except for a power source for plasma generation, a film-forming apparatus (e.g., a film-forming apparatus disclosed in Patent Document 1 or 2) having an external electrode with an internal space whose internal shape is substantially the same as or similar to the external shape of a container (i.e., a space for holding a container, hereinafter referred to as an "internal space"), that is, a so-called similarly-shaped external electrode. Another usable film-forming apparatus is one identical with, except for a power source for plasma generation, a film-forming apparatus (e.g., a film-forming apparatus disclosed in Patent Document 3 or 4) having an external electrode whose internal space has a cylindrical shape with bottom, that is, a so-called cylindrical external electrode. It is to be noted that in the case of such a film-forming apparatus having a cylindrical external electrode, a gap is left between the outer surface of the shoulder of a container and the inner surface of the internal space of the external electrode, and the gap may be filled with a spacer such as a dielectric material or may be empty. An electrode having an internal space larger than a bottle can also be used, and also in this case, a gap left between the surface of the bottle and the inner surface of the internal space of the external electrode may be filled with a spacer such as a dielectric material or may be empty. Yet another usable film-forming apparatus is one identical with, except for a power source for plasma generation, a film-forming apparatus (e.g., a film-forming apparatus disclosed in Patent Document 6) designed so that a gap between the outer surface of the shoulder of a container and the inner surface of the internal space of an external electrode has a predetermined relationship.
Patent Document 6: Japanese Patent No. 4188315

Figure 1:
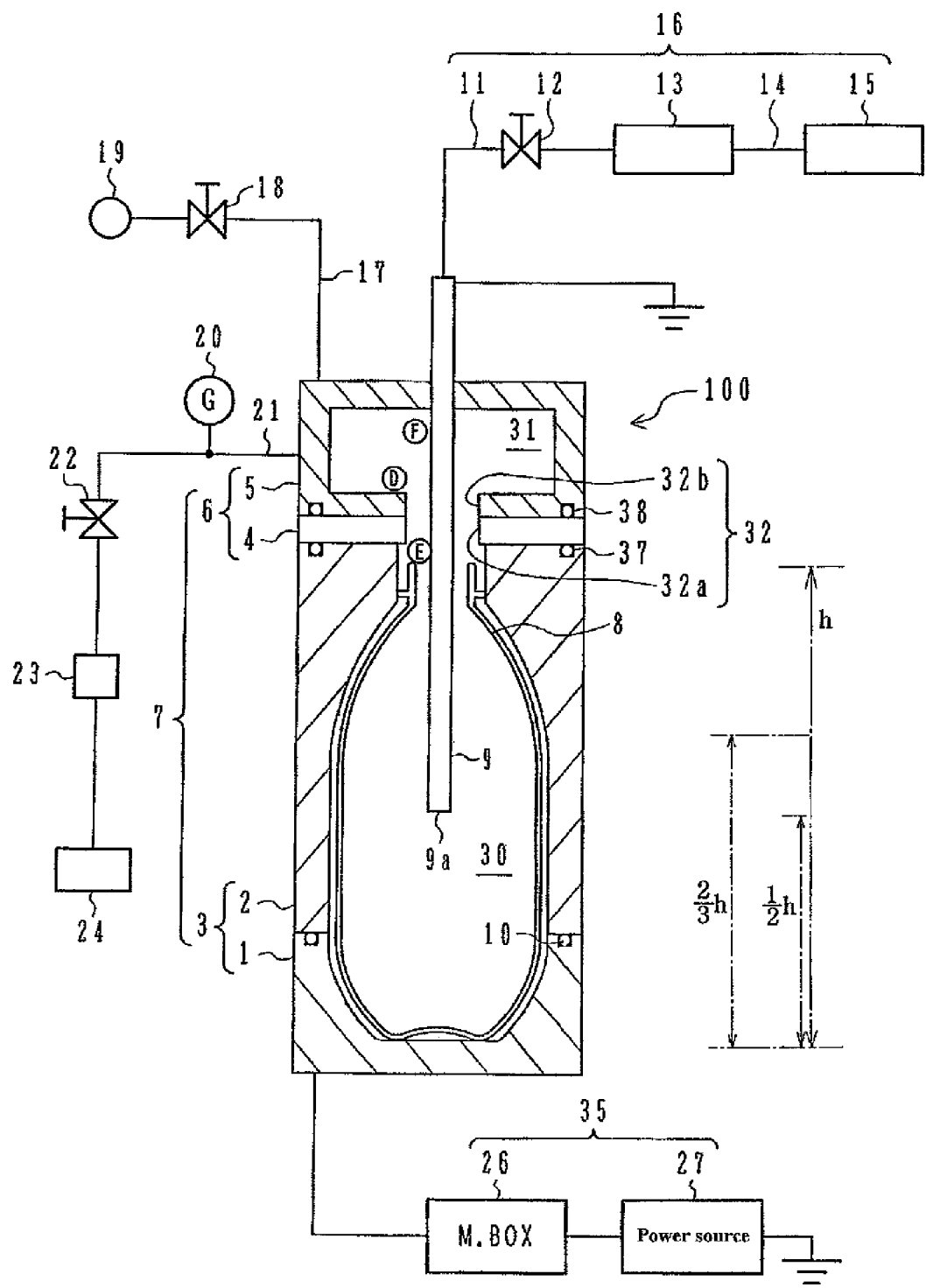
FIG. 1 is a schematic view of a film-forming apparatus having a similarly shaped external electrode.

Although the three types of film-forming apparatuses have been exemplified, a film-forming apparatus for use in this embodiment will be described with reference to the film-forming apparatus having a similarly shaped external electrode as a representative example of these film-forming apparatuses. FIG. 1 is a schematic view of a film-forming apparatus having a similarly shaped external electrode. FIG. 1 is a vertical sectional view, and the film-forming apparatus has a shape rotationally symmetric with respect to the main axis of a plastic container 8. Here, the main axis of the container is substantially coincident with the main axis of an internal electrode.

A film-forming apparatus 100 includes an external electrode 3 that serves as a film-forming unit in which the plastic container 8 is housed, an internal electrode 9 that is adapted to be removably inserted into the inside of the plastic container 8 and serves as a raw material gas supply tube, a vacuum pump 23 that is used to exhaust gas from the inside of the external electrode 3, a power source 27 for plasma generation that is connected to the external electrode 3, an exhaust chamber 5 that communicates with an internal space 30 of the external electrode 3 through a portion above the mouth of the plastic container 8, and an insulating member 4 that is used to provide electrical insulation between the external electrode 3 and the exhaust chamber 5.

The external electrode 3 is a hollow member made of a conductive material such as a metal and serving as a film-forming unit (vacuum chamber), and has the internal space 30 for holding the plastic container 8 as an object to be coated (e.g., a PET bottle made of a polyethylene terephthalate resin). The external electrode 3 includes an upper external electrode 2 and a lower external electrode 1, and is configured so that the upper end of the lower external electrode 1 can be detachably attached to the lower end of the upper external electrode 2 with an O-ring 10 being interposed therebetween. The plastic container 8 can be inserted into the internal space 30 by detaching the lower external electrode 1 from the upper external electrode 2. The external electrode 3 is hermetically sealed off from the outside by an O-ring 37 provided between the insulating member 4 and the external electrode 3 and the O-ring 10 provided between the upper external electrode 2 and the lower external electrode 1. It is to be noted that the external electrode 3 shown in FIG. 1 is separated into two parts, or the upper external electrode 2 and the lower external electrode 1, but the external electrode 3 may be separated into 3 or more parts for manufacturing convenience. In this case, each joint between adjacent two parts may be sealed with an O-ring.

The plastic container 8 generally has a shape in which its mouth is smaller in diameter than its body, but the detail of the plastic container 8 is not always standardized and may be appropriately changed depending on its design. Therefore, the shape of the shoulder, neck, or mouth of the container varies depending on the contents of the container. The internal space 30 provided in the external electrode 3 has an internal shape substantially the same as the external shape of the plastic container 8, and therefore when the plastic container 8 is housed in the internal space 30, there is little gap between them. However, there is a case that a gap of about several centimeters is acceptable. The gap is preferably filled with a dielectric spacer.

The exhaust chamber 5 is provided so as to communicate with the internal space 30 of the external electrode 3 through a portion above the mouth of the plastic container 8. The insulating member 4 is provided between the external electrode 3 and the exhaust chamber 5 to achieve electrical insulation between the external electrode 3 and the exhaust chamber 5.

The insulating member 4 has an opening 32a formed at a position corresponding to a position above the mouth of the plastic container 8. The opening 32a allows air communication between the external electrode 3 and the exhaust chamber 5. The insulating member 4 is preferably made of an inorganic material such as glass or ceramics or a heat-resistant resin.

The exhaust chamber 5 is a hollow member made of a conductive material such as a metal and has an internal space 31. The joint between the exhaust chamber 5 and the insulating member 4 is sealed with an O-ring 38. Further, an opening 32b having a shape substantially the same as the opening 32a is provided in the lower end of the exhaust chamber 5 corresponding to the position of the opening 32a to allow air communication between the internal space 31 and the internal space 30. The exhaust chamber 5 is connected to the vacuum pump 23 through an exhaust path including, for example, a pipe 21, a pressure gage 20 and a vacuum valve 22 to exhaust gas from the internal space 31.

A cover 6 is formed by placing the exhaust chamber 5 on the insulating member 4 and the external electrode 3 is to hermetically sealed. The cover 6 and the external electrode 3 constitute a sealable film-forming unit 7.

Examples of the plastic container according to the present invention include plastic bottles, plastic cups and plastic trays. Such plastic containers include containers used with their openings closed with a cover, plug, or seal and containers used with their openings opened without using them. The size of the opening of the container is determined depending on the contents to be packed. The plastic container 8 has a predetermined thickness so as to possess appropriate rigidity. The plastic containers do not include soft packaging materials formed from sheet materials having no rigidity. Examples of a material to be packed in the plastic container according to the present invention include drinks such as beer, sparkling liquor, carbonated drinks, fruit juice drinks and soft drinks, pharmaceutical products, agricultural chemicals and dried foods that hate moisture absorption.

Examples of a resin for use in molding the plastic container 8 include a polyethylene terephthalate (PET) resin, a polyethylene terephthalate-based copolyester resin (a copolymer called "PETG" which uses cyclohexanedimethanol instead of ethylene glycol as an alcohol component of polyester, manufactured by Eastman Chemical Company), a polybutylene terephthalate resin, a polyethylene naphthalate resin, a polyethylene resin, a polypropylene (PP) resin, a cycloolefin copolymer resin (COC, cyclic olefin copolymer), an ionomer resin, a poly-4-methylpenten-1 resin, a polymethyl methacrylate resin, a polystyrene resin, an ethylene-vinyl alcohol copolymer resin, an acrylonitrile resin, a polyvinyl chloride resin, a polyvinylidene chloride resin, a polyamide resin, a polyamide imide resin, a polyacetal resin, a polycarbonate resin, a polysulfone resin, a tetrafluoroethylene resin, an acrylonitrile-styrene resin and an acrylonitrile-butadiene-styrene resin. Among them, PET is particularly preferred.

The internal electrode 9 also serves as a raw material gas supply tube, and therefore a gas flow channel, through which a raw material gas flows, is provided inside the internal electrode 9. At the distal end of the internal electrode 9, a gas outlet 9a, that is, an opening of the gas flow channel is provided. The internal electrode 9 is placed in the film-forming unit 7 with its one end being fixed by the wall of the internal space 31 of the exhaust chamber 5. When the plastic container 8 is set in the external electrode 3, the internal electrode 9 is placed in the external electrode 3 and inserted into the inside of the plastic container 8 through the mouth of the plastic container 8. That is, when the proximal end of the internal electrode 9 is located at the upper end of the inner wall of the exhaust chamber 5, the internal electrode 9 extends to the internal space 30 of the external electrode 3 through the internal space 31 and the openings 32a and 32b. The internal electrode 9 is preferably grounded. The distal end (9a) of the internal electrode 9 is placed in the inside of the plastic container 8. The position of the distal end (9a) of the internal electrode 9 will be described later in detail.

A raw material gas supply means 16 introduces a raw material gas supplied from a raw material gas generation source 15 into the inside of the plastic container 8. More specifically, one end of a pipe 11 is connected to the proximal end of the internal electrode 9, and the other end of the pipe 11 is connected to one end of a mass flow controller 13 through a vacuum valve 12. The other end of the mass flow controller 13 is connected to the raw material gas generation source 15 through a pipe 14. The raw material gas generation source 15 generates a hydrocarbon gas-based raw material gas such as acetylene.

The term "gas barrier thin film" as used herein refers to a thin film that suppresses oxygen permeation, and examples of such a thin film include carbon films including DLC (diamond like carbon) films, Si-containing carbon films, metal oxide films such as $SiO_x$ films, and the like. As a raw material gas generated by the raw material gas generation source 15, a volatile gas containing elements constituting such a thin film is selected. As such a raw material gas for forming a gas barrier thin film, a well-known volatile raw material gas conventionally used is used.

Examples of a raw material gas for use in forming a DLC film include aliphatic hydrocarbons, aromatic hydrocarbons, oxygen-containing hydrocarbons, nitrogen-containing hydrocarbons, and the like, which are liquids or gases at room temperature. Particularly, benzene, toluene, o-xylene, m-xylene, p-xylene, cyclohexane, and the like which have 6 or more carbon atoms are preferred. From the viewpoint of hygiene, preferred examples of a raw material gas for use in forming a DLC film on containers for food and the like are aliphatic hydrocarbons, especially ethylene-based hydrocarbons such as ethylene, propylene and butylenes, and acetylene-based hydrocarbons such as acetylene, allylene and 1-butyne. These raw materials may be used singly or a mixed gas of two or more of them may be used. These gases may be diluted with a noble gas such as argon or helium when used. In the case of forming a silicon-containing DLC film, a Si-containing hydrocarbon-based gas is used. In the case of forming a $SiO_x$ film, a Si-containing hydrocarbon gas and oxygen are supplied to the gas introduction tube to use. Likewise, also in the case of forming another metal oxide film, a raw material gas containing the metal, and oxygen are used.

The term "DLC film" as used herein refers to a film called an i carbon film or a hydrogenated amorphous carbon film (a-C:H), and also includes a hard carbon film. Further, a DLC film is an amorphous carbon film and has $SP^3$ bonding. As a raw material gas for forming such a DLC film, a hydrocarbon-based gas such as acetylene gas is used. As a raw material gas for forming a Si-containing DLC film, a Si-containing hydrocarbon-based gas is used. By forming such a DLC film on the inner wall surface of a plastic container, it is possible to obtain a one-way or returnable container as a container for beer, sparkling liquor, carbonated drinks, sparkling drinks, or the like.

As described above, in the case of forming a Si-containing DLC film, a Si-containing hydrocarbon-based gas is used. Examples of a hydrocarbon silicide gas or a hydrogen silicide gas include silicon tetrachloride, silane ($SiH_4$), organic silane compounds such as hexamethyl disilane, vinyl trimethyl silane, methyl silane, dimethyl silane, trimethyl silane, diethyl silane, propyl silane, phenyl silane, methyl triethoxy silane, vinyl triethoxy silane, vinyl trimethoxy silane, tetramethoxy silane, tetraethoxy silane, phenyl trimethoxy silane, methyl trimethoxy silane and methyl triethoxy silane, organic siloxane compounds such as octamethylcyclotetrasiloxane, 1,1,3,3-tetramethyldisiloxane and hexamethyldisiloxane (HMDSO), and the like. In addition to these materials, aminosilane, silazane and the like are also used. In the case of forming an aluminum oxide thin film ($AlO_x$ film) as a metal oxide thin film, for example, trialkylaluminum, trimethylaluminum, triethylaluminum, dialkylaluminum, triisopropylaluminum, tri-n-butylaluminum or dimethylisopropyl aluminum is used.

The vacuum pump 23 exhausts gas from the inside of the film-forming unit 7. More specifically, one end of the pipe 21 is connected to the exhaust chamber 5, the other end of the pipe 21 is connected to the vacuum valve 22, and the vacuum valve 22 is connected to the vacuum pump 23 through a pipe. The vacuum pump 23 is further connected to an exhaust duct 24. It is to be noted that the pressure gage 20 is connected to the pipe 21 to detect the pressure in the exhaust path. By actuating the vacuum pump 23, gas in the plastic container 8 and gas in the internal space 30 of the external electrode 3 are moved to the internal space 31 of the exhaust chamber 5 through the openings 32a and 32b, and gas in the internal space 31 is sent to the vacuum pump 23 through the exhaust path including the pipe 21.

The film-forming unit 7 is connected to a pipe 17 for leak, and the pipe 17 communicates with a leak source 19 (open to the atmosphere) through a vacuum valve 18.

A power supply means 35 for plasma generation includes the power source 27 for plasma generation and an automatic matching device 26 connected to the power source 27 for plasma generation. The power source 27 for plasma generation is connected to the external electrode 3 through the automatic matching device 26. When the output of the power source 27 for plasma generation is applied to the external electrode 3, a potential difference is generated between the internal electrode 9 and the external electrode 3 so that plasma is generated from the raw material gas supplied to the inside of the plastic container 8. The frequency of the power source 27 for plasma generation is in the range of 5.5 to 6.5 MHz. A power source with a fixed frequency in this range is used. Alternatively, a power source whose frequency is variable in this range may be used.

The film-forming unit 7 shown in FIG. 1 is configured so that the mouth of the plastic container 8 is directed upward, but the film-forming unit 7 may be configured so that the mouth of the plastic container 8 is directed downward. In this case, foreign matters that have entered the internal space of the container before film formation can be easily removed. This makes it possible to prevent the occurrence of coating defects during film formation. Further, it is also possible to prevent reattaching of substances derived from the raw material gas for forming a thin film to the bottle at the end of film formation.

Hereinbelow, the method for producing a gas barrier thin film-coated plastic container according to the embodiment of the present invention will be described with reference to a case that a DLC film is formed. The method for producing a gas barrier thin film-coated plastic container according to the present invention includes the steps of: (1) housing the plastic container 8 in the external electrode 3 serving as the film-forming unit 7; (2) placing the internal electrode 9 serving as a raw material gas supply tube in the inside of the plastic container 8; (3) exhausting gas from the inside of the external electrode 3 by activating the vacuum pump 23; (4) blowing a raw material gas into the inside of the plastic container 8 under a reduced pressure; and (5) forming a gas barrier thin film on the inner wall surface of the plastic container 8 by generating plasma from the raw material gas, setting a power source frequency of a power source for plasma generation to supply power to the external electrode 3 to be 5.5 to 6.5 MHz.
(Step of Housing Plastic Container and Step of Placing Internal Electrode)

The inside of the film-forming unit 7 is opened to the atmosphere by opening the vacuum valve 18, and the external electrode 3 is in a state that the lower external electrode 1 is detached from the upper external electrode 2. Then, the plastic container 8 is inserted into a space inside the upper external electrode 2 from the lower side of the upper external electrode 2 to set the plastic container 8 in the internal space 30 of the external electrode 3. At this time, the internal electrode 9 is inserted into the plastic container 8. Then, the lower external electrode 1 is attached to the lower end of the upper external electrode 2, and the external electrode 3 is hermetically sealed with the O-ring 10. In this way, the plastic container 8 is housed in the internal space 30 of the external electrode 3 and the internal electrode 9 is placed inside the plastic container 8.
(Step of Exhausting Gas from Inside of External Electrode)

Then, gas in the plastic container 8 is replaced with a raw material gas and the pressure in the plastic container 8 is adjusted to a predetermined pressure for film formation. More specifically, as shown in FIG. 1, the vacuum valve 22 is opened after the vacuum valve 18 is closed, and the vacuum pump 23 is activated to exhaust gas from the inside of the external electrode 3 through the exhaust chamber 5 electrically insulated from the external electrode 3 by the insulating member 4. As a result, gas is exhausted from the inside of the film-forming unit 7, including the inside of the plastic container 8, through the pipe 21 so that the inside of the film-forming unit 7 is evacuated. At this time, the pressure in the film-forming unit 7 is, for example, 0.1 to 50 Pa.
(Step of Blowing Raw Material Gas)

Then, the vacuum valve 12 is opened, and a hydrocarbon gas such as acetylene gas is generated by the raw material gas generation source 15. The hydrocarbon gas is introduced into the pipe 14. The hydrocarbon gas whose flow rate is controlled by the mass flow controller 13 is blown from the gas outlet 9a through the pipe 11 and the internal electrode (raw material gas supply tune) 9 at an earth potential to introduce the hydrocarbon gas into the plastic container 8. Further, the pressure in the film-forming unit 7 and the plastic container 8 is stabilized and maintained at a pressure suitable for forming a DLC film (e.g., about 1 to 100 Pa) by a balance between the controlled gas flow rate and the capability of exhausting gas.
(Step of Forming Gas Barrier Thin Film)

Then, power with a power source frequency of 5.5 to 6.5 MHz (e.g., 6.0 MHz) is supplied to the external electrode 3 while the raw material gas is blown into the inside of the plastic container 8 under a predetermined reduced pressure. This power is used as an energy source to generate plasma from the raw material gas contained in the plastic container 8. In this way, a DLC film is formed on the inner wall surface of the plastic container 8. More specifically, a bias voltage is applied between the external electrode 3 and the internal electrode 9 by supplying power with a power source frequency of 5.5 to 6.5 MHz to the external electrode 3, and hydrocarbon-based plasma is generated from the raw material gas contained in the plastic container 8 so that a DLC film is formed on the inner wall surface of the plastic container 8. At this time, the automatic matching device 26 performs impedance matching by inductance L and capacitance C so that a reflected wave from the entire electrode to which output is supplied is minimized.

Figure 2:
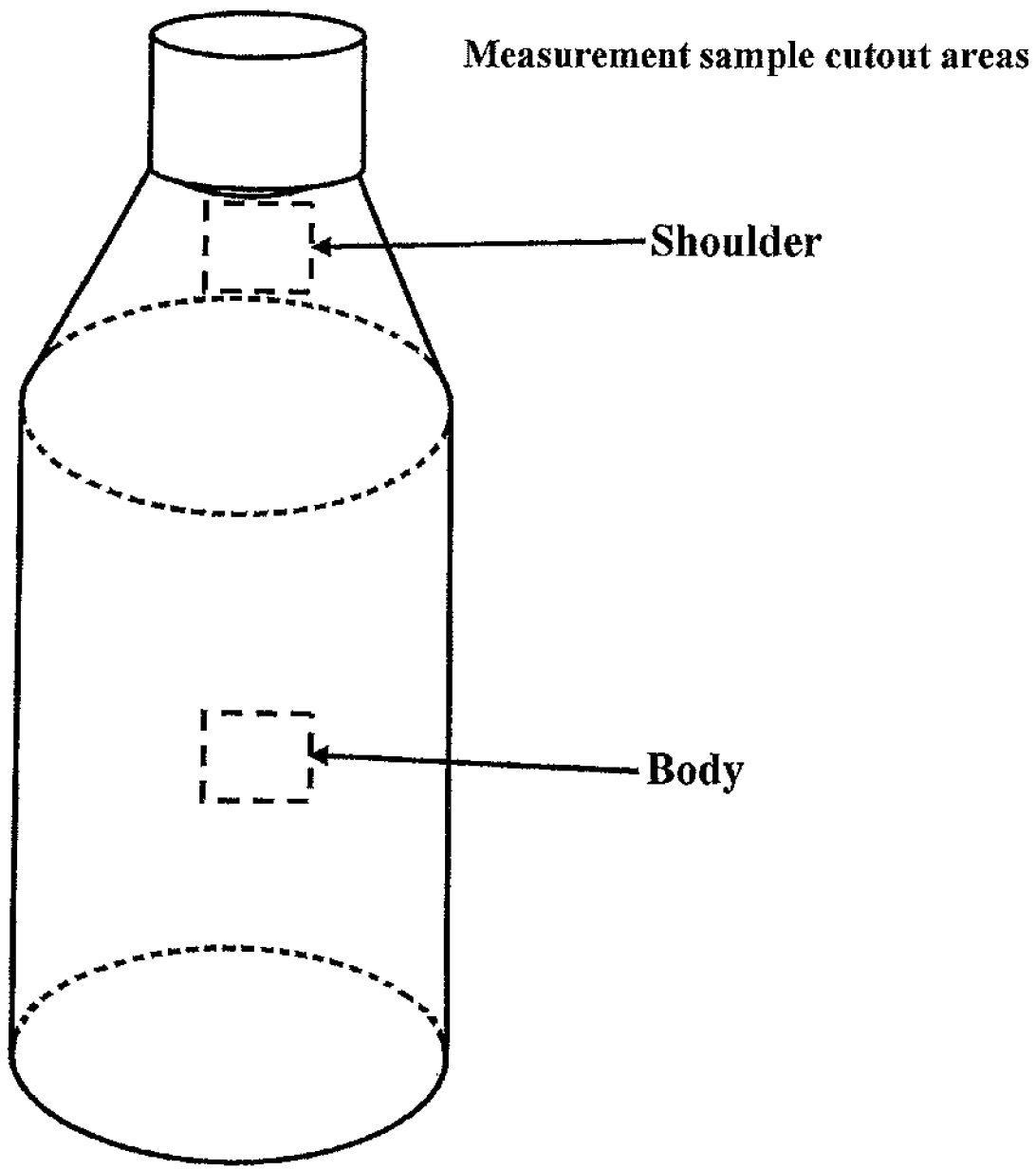
FIG. 2 is a schematic view of a plastic container, which shows the positions of "shoulder" and "body" of the plastic container.

FIG. 2 shows the positions of the "shoulder" and "body" of the plastic container 8. The "shoulder" is defined as an area located in the neck of the container whose diameter is reduced toward its upper end along the main axis of the container and below the screw portion of the mouth of the container. The "body" is defined as an area in the waistless part of the container below the shoulder, which is located at the middle of the height of the waistless part.

By setting the power source frequency to a value within a narrow range of 5.5 to 6.5 MHz, the following effects (1) to (3) contributing to improvements in the quality of the container and in production efficiency (due to a reduced frequency of cleaning the apparatus) are specifically obtained: (1) gas barrier properties can be maximally improved; (2) the container can offer an excellent design because its coloration derived from carbon contained in the DLC film is light and a difference in color between the shoulder and the body of the container is small; and (3) the amount of raw material gas-derived dust deposited in the exhaust chamber 5 can be reduced. If the power source frequency is not within the range of 5.5 to 6.5 MHz, the merits (1) to (3) cannot be obtained at the same time. If the power source frequency is less than 5.5 MHz, coloration derived from carbon contained in the DLC film is darker in the body than in the shoulder of the container (if dark coloration is caused, the film shows a color of brown to black), and coloration is dark on average. This tendency becomes conspicuous when the container is a bottle having a capacity of 500 mL or more. Further, the adhesiveness of the film is reduced. On the other hand, if the power source frequency exceeds 6.5 MHz, coloration derived from carbon contained in the DLC film is darker in the shoulder than in the body of the container, and if the power source frequency reaches 13.56 MHz, coloration is apparently dark on average. Further, the amount of raw material gas-derived dust deposited in the exhaust chamber 5 is increased. Further, an area near the opening 32b of the exhaust chamber 5 is etched by plasma, and therefore the surface of the exhaust chamber 5 is shaved.

When the power source frequency is shifted toward higher values, the position of the center of plasma (the position at which the concentration of plasma is highest) moves toward the mouth of the container. On the other hand, when the power source frequency is shifted toward lower values, the position of the center of plasma moves toward the bottom of the container. It can be considered that when the power source frequency is in the range of 5.5 to 6.5 MHz, the distribution of plasma such that all of gas barrier properties, coloration and minimization of dust deposited in the exhaust chamber are satisfied can be achieved. It is to be noted that this does not depend on the capacity (e.g., 250 mL to 2 L) of the container and does not depend on the output of the power source (W) (e.g., 400 to 2000 W) as long as the film-forming unit 7 has a structure composed of the external electrode 3, the insulating member 4 and the exhaust chamber 5. Further, it can be considered that the suitable power source frequency that allows all the merits (1) to (3) to be obtained at the same time is hardly influenced by the width and length of the shape of the film-forming unit 7 as long as the film-forming unit 7 has a substantially cylindrical shape with bottom. Therefore, even when a conventional film-forming apparatus is used, the quality of a container can be maximally improved and high production efficiency can be achieved by setting the power source frequency of the apparatus to 5.5 to 6.5 MHz without complicating the structure of the apparatus and adding another structure to the apparatus.

As described above, the distal end (9a) of the internal electrode 9 is placed inside the plastic container 8. Here, the height of the plastic container 8 is defined as "h" and the bottom of the container is defined as a reference point, as shown in FIG. 1, the internal electrode (raw material gas supply tube) 9 is preferably inserted so that its distal end is located at a position of ½·h or higher but ⅔·h or lower. If the distal end of the internal electrode (raw material gas supply tube) 9 is located at a position lower than ½·h, there is a case that a film tends to be deposited on the bottom and the lower part of the body of the container more than needs and therefore conspicuous coloration is caused. In addition, deposition of carbon dust on the outer surface of the gas introduction tube becomes conspicuous. On the other hand, if the distal end of the internal electrode 9 is located at a position higher than ⅔·h, there is a case that plasma ignition failure occurs.

Then, the output of the power source 27 for plasma generation is stopped to eliminate plasma to stop formation of the DLC film. At substantially the same time, the vacuum valve 12 is closed to stop the supply of the raw material gas.

Then, the hydrocarbon gas remaining in the film-forming unit 7 and the plastic container 8 is removed by the vacuum pump 23. Then, the vacuum valve 22 is closed to stop the discharge of the gas. At this time, the pressure in the film-forming unit 7 is 1 to 100 Pa. Thereafter, the vacuum valve 18 is opened. As a result, the film-forming unit 7 is opened to the atmosphere.

In every case, the time for film formation is as short as about several seconds. The DLC film is formed so as to have a thickness of 5 to 100 nm.

Examples

Hereinbelow, the present invention will be described in more detail with reference to Examples, but the present invention is not construed as being limited to these Examples.

A DLC film was formed on the inner surface of a 500 mL-PET bottle (resin amount: 29 g, height: 204 mm) and on the inner surface of a 280 mL-PET bottle (resin amount: 26 g, height: 132 mm) with the use of the film-forming apparatus shown in FIG. 1. A raw material gas was acetylene, the flow rate of the raw material gas was set to 80 sccm (500 mL-PET bottle) or 90 sccm (280 mL-PET bottle), and the time for film formation was set to 2 seconds. As a power source for plasma generation, one whose frequency was variable in the range of 2.50 to 13.56 MHz (2.5 to 7 MHz: NR1.5F5-7M-01 manufactured by Noda RF Technologies Co., Ltd.) (13.56 MHz: NAH-1013-2Y manufactured by Japan Radio Co., Ltd.) was used. Film formation was performed at various frequencies in the range of 2.50 to 13.56 MHz. In all the samples, the thickness of the DLC film was about 20 nm.

(Oxygen Barrier Property)

Figure 3:
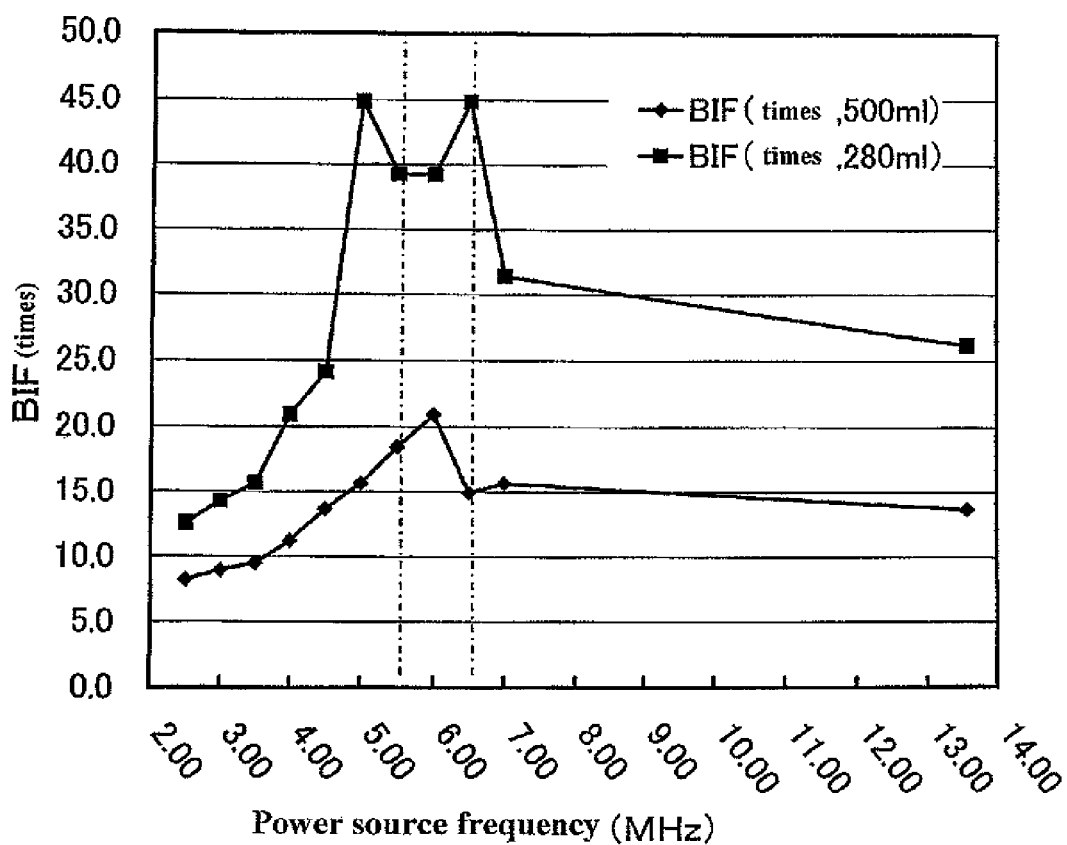
FIG. 3 is a graph showing the relationship between a power source frequency and oxygen barrier properties.

The oxygen barrier properties of the DLC film-coated 500 mL-PET bottle are shown in Table 1. The oxygen permeability of the container was measured under conditions of 23° C. and 90% RH using Oxtran 2/20 manufactured by Modern Control Company, and measurement values after 72 hours from the start of nitrogen gas replacement (OTR values in Table 1) are described. The thickness of the DLC film was measured using Alpha-step iQ manufactured by KLA-Tencor Corporation. Further, the oxygen barrier properties of the DLC film-coated 280 mL-PET bottle are shown in Table 2. In Tables 1 and 2, "BIF" value is a value representing the degree of improvement in oxygen barrier properties as compared to a DLC film-uncoated bottle, which is expressed in "times". FIG. 3 is a graph obtained by plotting the results shown in Tables 1 and 2.

TABLE 1

| | [500 mL bottle 29 g] 1000 W, 80 sccm, 2 sec, N = 2 | | | | | | | | | | |
|---|---|---|---|---|---|---|---|---|---|---|---|
| Frequency (MHz) | (Uncoated) | 2.50 | 3.00 | 3.50 | 4.00 | 4.50 | 5.00 | 5.50 | 6.00 | 6.50 | 7.00 | 13.56 |
| OTR(cc/day) | 0.0314 | 0.0038 | 0.0035 | 0.0033 | 0.0028 | 0.0023 | 0.0020 | 0.0017 | 0.0015 | 0.0021 | 0.0020 | 0.0023 |
| BIF(times, 500 mL) | 1 | 8.3 | 9.0 | 9.5 | 11.2 | 13.7 | 15.7 | 18.5 | 20.9 | 15.0 | 15.7 | 13.7 |

TABLE 2

| | [280 mL bottle 26 g] 1000 W, 90 sccm, 2 sec, N = 2 | | | | | | | | | | |
|---|---|---|---|---|---|---|---|---|---|---|---|
| Frequency (MHz) | (Uncoated) | 2.50 | 3.00 | 3.50 | 4.00 | 4.50 | 5.00 | 5.50 | 6.00 | 6.50 | 7.00 | 13.56 |
| OTR(cc/day) | 0.0213 | 0.0025 | 0.0022 | 0.0020 | 0.0015 | 0.0013 | 0.0007 | 0.0008 | 0.0008 | 0.0007 | 0.0010 | 0.0012 |
| BIF(times, 280 mL) | 1 | 12.6 | 14.3 | 15.7 | 20.9 | 24.2 | 44.9 | 39.3 | 39.3 | 44.9 | 31.4 | 26.2 |

(Coloration)

The color of the plastic container was evaluated by evaluating the degree of coloration using the b* value as an indicator. The b* value is a color difference specified in JIS K 7105-1981 and is determined from tristimulus values X, Y and Z by the following formula 1.

$$b^* = 200[(Y/Y_0)^{1/3} - (Z/Z_0)^{1/3}]$$ [Mathematical Formula 1]

A U-3500 model automatic recording spectrophotometer manufactured by Hitachi equipped with a 60 Φ integrating sphere attachment (for IR/VIS/NIR) manufactured by the same company was used. As detectors, an ultrahigh sensitivity photomultiplier (R928: for UV/VIS) and a cooling-type PbS (for the NIR range) were used. Transmittance was measured at wavelengths from 240 nm to 840 nm. By measuring the transmittance of the PET container, it is possible to calculate the transmittance measurement of only the DLC film, but in this Example, the b* value is directly shown as a calculation including the absorptance of the PET container. It is to be noted that a rough correlation between the b* value and visual observation in the present invention is as shown in Table 3. The b* value of an unprocessed PET container is in the range of 0.6 to 1.0. Further, it can be said that when the b* value is 2 or less, the PET container is colorless and transparent.

TABLE 3

| b* Value | 0-2 | 2-4 | 4-6 | 6-8 | 8- |
|---|---|---|---|---|---|
| Expression by Visual Observation | Colorless | Very light yellowish brown color | Light yellowish brown color | Slightly dark yellowish brown color | Dark yellowish brown color |

Figure 4:
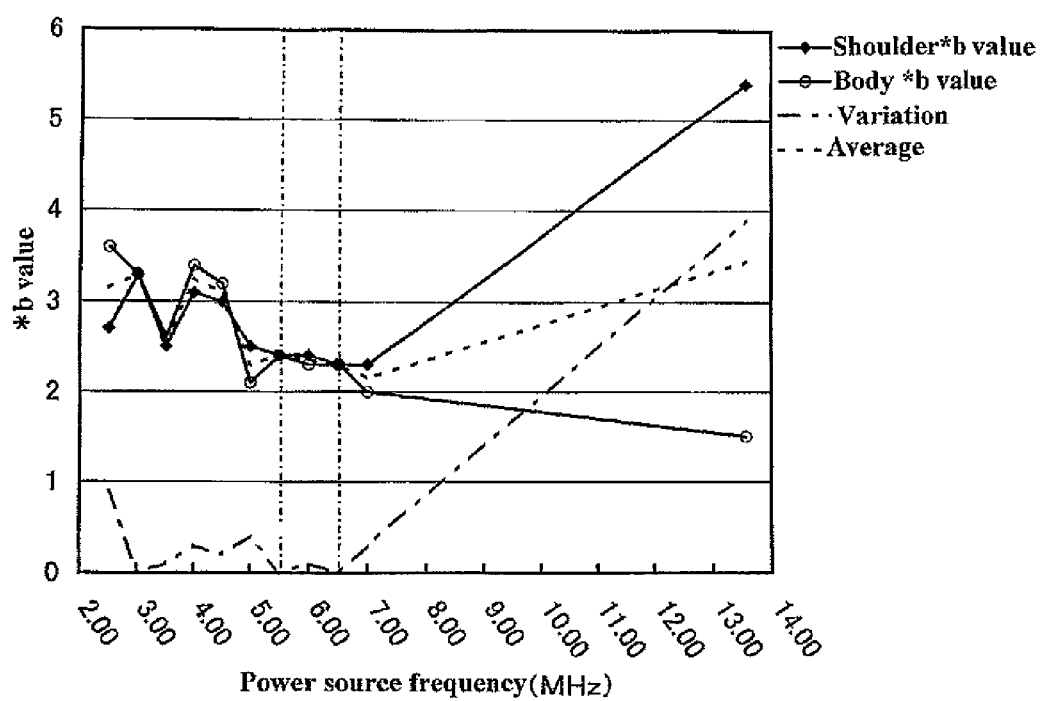
FIG. 4 is a graph showing the relationship between a power source frequency and coloration when a DLC film is formed on a 500 mL-PET bottle.
Figure 5:
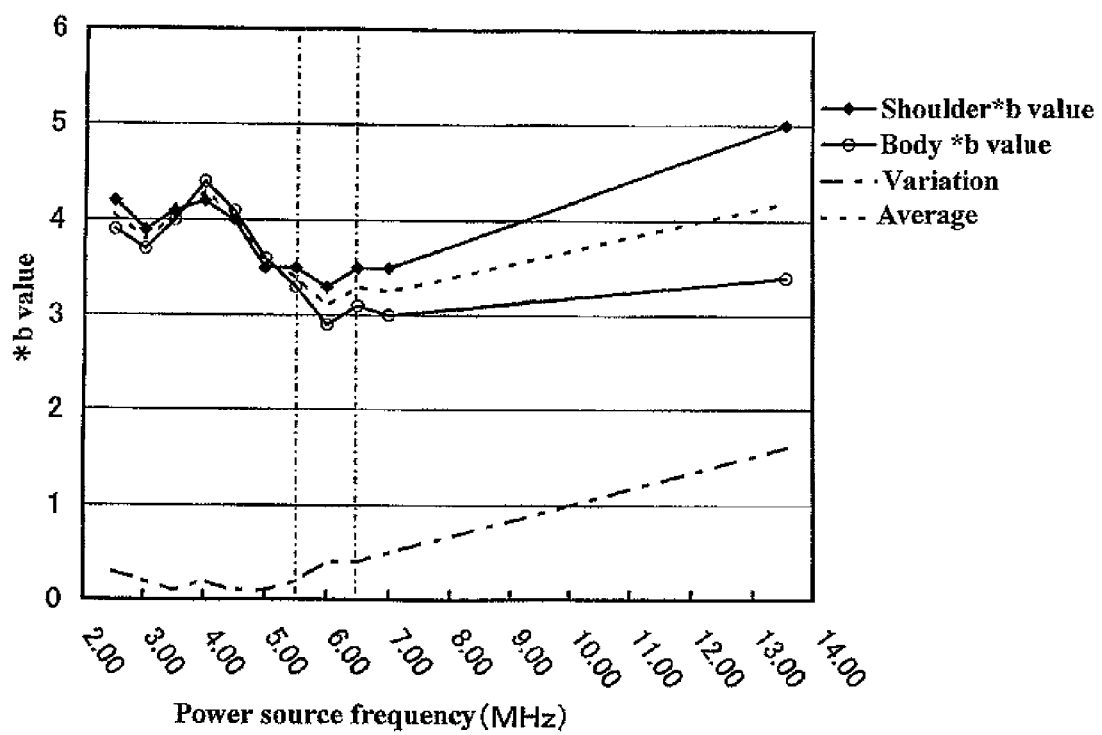
FIG. 5 is a graph showing the relationship between a power source frequency and coloration when a DLC film is formed on a 280 mL-PET bottle.

Table 4 shows the evaluation results of coloration of the DLC film-coated 500 mL-PET bottle. Table 5 shows the evaluation results of coloration of the DLC film-coated 280 mL-PET bottle. FIG. 4 is a graph obtained by plotting the results shown in Table 4, and FIG. 5 is a graph obtained by plotting the results shown in Table 5.

The "variation" of the 500 mL-PET bottle shown in Table 4 was evaluated in the following manner. The absolute value of the difference between the b* value of the shoulder and the b* value of the body of the PET bottle was defined as x, and was evaluated according to the following criteria.

Evaluation (variation) x: x≥3
Evaluation (variation) Δ: 0.5≤x<3
Evaluation (variation) ○: x<0.5

The "average" of the 500 mL-PET bottle shown in Table 4 is the average degree of coloration, and was evaluated in the following manner. The average of the b* value of the shoulder and the b* value of the body of the PET bottle was defined as x, and was evaluated according to the following criteria.

Evaluation (average) x: x≥3
Evaluation (average) Δ: 2.5≤x<3
Evaluation (average) ○: x<2.5

The "variation" of the 280 mL-PET bottle shown in Table 5 was evaluated in the following manner. The absolute value of the difference between the b* value of the shoulder and the b* value of the body of the PET bottle was defined as x, and was evaluated according to the following criteria.

Evaluation (variation) x: x≥1
Evaluation (variation) Δ: 0.5≤x<1
Evaluation (variation) ○: x<0.5

The "average" of the 280 mL-PET bottle shown in Table 5 is the average degree of coloration, and was evaluated in the following manner. The average of the b* value of the shoulder and the b* value of the body of the PET bottle was defined as x, and was evaluated according to the following criteria.

Evaluation (average) x: x≥4
Evaluation (average) Δ: 3.5≤x<4
Evaluation (average) ○: x<3.5

The coloration of the PET bottle was comprehensively evaluated by evaluating a combination of the evaluation result of "variation" and the evaluation result of "average" (not in particular order) according to the following criteria.

Evaluation x: x+x, x+Δ (poor in appearance)
Evaluation Δ: x+Δ (comparable to the level of conventional product)
Evaluation ○: ○+Δ (comparable to the level of improved conventional product)
Evaluation ⊙: ○+○ (particularly excellent in coloration)

TABLE 4

[500 mL bottle 29 g]

| MHz | (Uncoated) | 2.50 | 3.00 | 3.50 | 4.00 | 4.50 | 5.00 | 5.50 | 6.00 | 6.50 | 7.00 | 13.56 |
|---|---|---|---|---|---|---|---|---|---|---|---|---|
| Shoulder *b value | 0.1 | 2.7 | 3.3 | 2.5 | 3.1 | 3 | 2.5 | 2.4 | 2.4 | 2.3 | 2.3 | 5.4 |
| Body *b value | 0 | 3.6 | 3.3 | 2.6 | 3.4 | 3.2 | 2.1 | 2.4 | 2.3 | 2.3 | 2 | 1.5 |
| Variation | | 0.9 | 0.0 | 0.1 | 0.3 | 0.2 | 0.4 | 0.0 | 0.1 | 0.0 | 0.3 | 3.9 |
| Evaluation (variation) | | Δ | ○ | ○ | ○ | ○ | ○ | ○ | ○ | ○ | ○ | X |
| Average | | 3.15 | 3.30 | 2.55 | 3.25 | 3.10 | 2.30 | 2.40 | 2.35 | 2.30 | 2.15 | 3.45 |
| Evaluation (average) | | X | X | Δ | X | X | ○ | ○ | ○ | ○ | ○ | X |
| Comprehensive evaluation | | X | Δ | ○ | Δ | Δ | ⊙ | ⊙ | ⊙ | ⊙ | ⊙ | X |

TABLE 5

[280 mL bottle 26 g]

| MHz | (Uncoated) | 2.50 | 3.00 | 3.50 | 4.00 | 4.50 | 5.00 | 5.50 | 6.00 | 6.50 | 7.00 | 13.56 |
|---|---|---|---|---|---|---|---|---|---|---|---|---|
| Shoulder *b value | 0.1 | 4.2 | 3.9 | 4.1 | 4.2 | 4 | 3.5 | 3.5 | 3.3 | 3.5 | 3.5 | 5 |
| Body *b value | 0 | 3.9 | 3.7 | 4 | 4.4 | 4.1 | 3.6 | 3.3 | 2.9 | 3.1 | 3 | 3.4 |
| Variation | | 0.3 | 0.2 | 0.1 | 0.2 | 0.1 | 0.1 | 0.2 | 0.4 | 0.4 | 0.5 | 1.6 |
| Evaluation (variation) | | ○ | ○ | ○ | ○ | ○ | ○ | ○ | ○ | ○ | Δ | X |
| Average | | 4.05 | 3.80 | 4.05 | 4.30 | 4.05 | 3.55 | 3.40 | 3.10 | 3.30 | 3.25 | 4.20 |
| Evaluation (average) | | X | Δ | X | X | X | Δ | ○ | ○ | ○ | ○ | X |
| Comprehensive evaluation | | Δ | ○ | Δ | Δ | Δ | ○ | ⊙ | ⊙ | ⊙ | ○ | X |

(Film Adhesiveness)

Table 6 shows the evaluation results of film adhesiveness of the DLC film-coated 500 mL-PET bottle. The evaluation of film adhesiveness was performed in the following manner. The container was immersed in an aqueous sodium hydroxide solution (0.01 mass %) with a pH of 9 maintained at 65° C., and the presence or absence of peeling-off of the film was examined before immersion (Day 0) and after immersion for one day (Day 1), two days (Day 2), three days (Day 3) and four days (Day 4).

○: No peeling was observed.
Δ: A piece of film having a length of less than 5 mm was peeled off.
x: A piece of film having a length of 5 mm or longer was peeled off.

Table 7 shows the evaluation results of film adhesiveness of the DLC film-coated 280 mL-PET bottle. The evaluation of film adhesiveness was performed in the following manner. The container was immersed in an aqueous sodium hydroxide solution (0.01 mass %) with a pH of 9 maintained at 80° C., and the presence or absence of peeling-off of the film was examined before immersion (Day 0) and after immersion for one day (Day 1), two days (Day 2), three days (Day 3) and four days (Day 4)

○: No peeling was observed.
Δ: A piece of film having a length of less than 5 mm was peeled off.
x: A piece of film having a length of 5 mm or longer was peeled off.

Table 9 shows the mass change of the raw material gas introduction tube when a DLC film was formed on a 500 mL-PET bottle. A detachable tubular member made of stainless steel was attached to the outer surface of the raw material gas introduction tube at a position just downstream from the

TABLE 6

[500 mL bottle 29 g] 1000 W, 80 sccm, 2 sec, N = 2, pH = 9 (NaOH 0.01%), 65° C. storage

| | Frequency (MHz) | 2.50 | 3.00 | 3.50 | 4.00 | 4.50 | 5.00 | 5.50 | 6.00 | 6.50 | 7.00 | 13.56 |
|---|---|---|---|---|---|---|---|---|---|---|---|---|
| Adhesiveness state | Day 0 | ○○ | ○○ | ○○ | ○○ | ○○ | ○○ | ○○ | ○○ | ○○ | ○○ | ○○ |
| | Day 1 | ○○ | ○○ | ○○ | ○○ | ○○ | ○○ | ○○ | ○○ | ○○ | ○○ | ○○ |
| | Day 2 | ΔΔ | ΔΔ | Δ○ | Δ○ | ○Δ | Δ○ | ○○ | ○○ | ○○ | ○○ | ○○ |
| | Day 3 | ΔΔ | ΔΔ | ΔΔ | ΔΔ | ΔΔ | Δ○ | Δ○ | ΔΔ | ΔΔ | ○Δ | ΔΔ |
| | Day 4 | ΔΔ | ΔΔ | ΔΔ | ΔΔ | ΔΔ | ΔΔ | ΔΔ | ΔΔ | ΔΔ | ΔΔ | ΔΔ |

○: No peeling piece,
Δ: Peeling piece with a length of less than 5,
X: Peeling piece with a length of 5 mm or longer

TABLE 7

[280 mL bottle 26 g] 1000 W, 90 sccm, 2 sec, N = 2, pH = 9 (NaOH 0.01%), 80(C. storage

| | Frequency (MHz) | 2.50 | 3.00 | 3.50 | 4.00 | 4.50 | 5.00 | 5.50 | 6.00 | 6.50 | 7.00 | 13.56 |
|---|---|---|---|---|---|---|---|---|---|---|---|---|
| Adhesiveness state | Day 0 | ○○ | ○○ | ○○ | ○○ | ○○ | ○○ | ○○ | ○○ | ○○ | ○○ | ○○ |
| | Day 1 | ○○ | ○○ | ○○ | ○○ | ○○ | ○○ | ○○ | ○○ | ○○ | ○○ | ○○ |
| | Day 2 | ΔΔ | ○Δ | Δ○ | ΔΔ | ΔΔ | ΔΔ | ΔΔ | ΔΔ | ΔΔ | ΔΔ | ΔΔ |
| | Day 3 | XΔ | ΔX | XΔ | ΔX | ΔX | XΔ | ΔΔ | ΔΔ | ΔΔ | ΔΔ | ΔΔ |
| | Day 4 | XX | XX | XX | XX | XX | XX | XX | XX | XX | XX | XX |

○: No peeling piece,
Δ: Peeling piece with a length of less than 5,
X: Peeling piece with a length of 5 mm or longer (Evaluation of Dust Generation)

Figure 6:
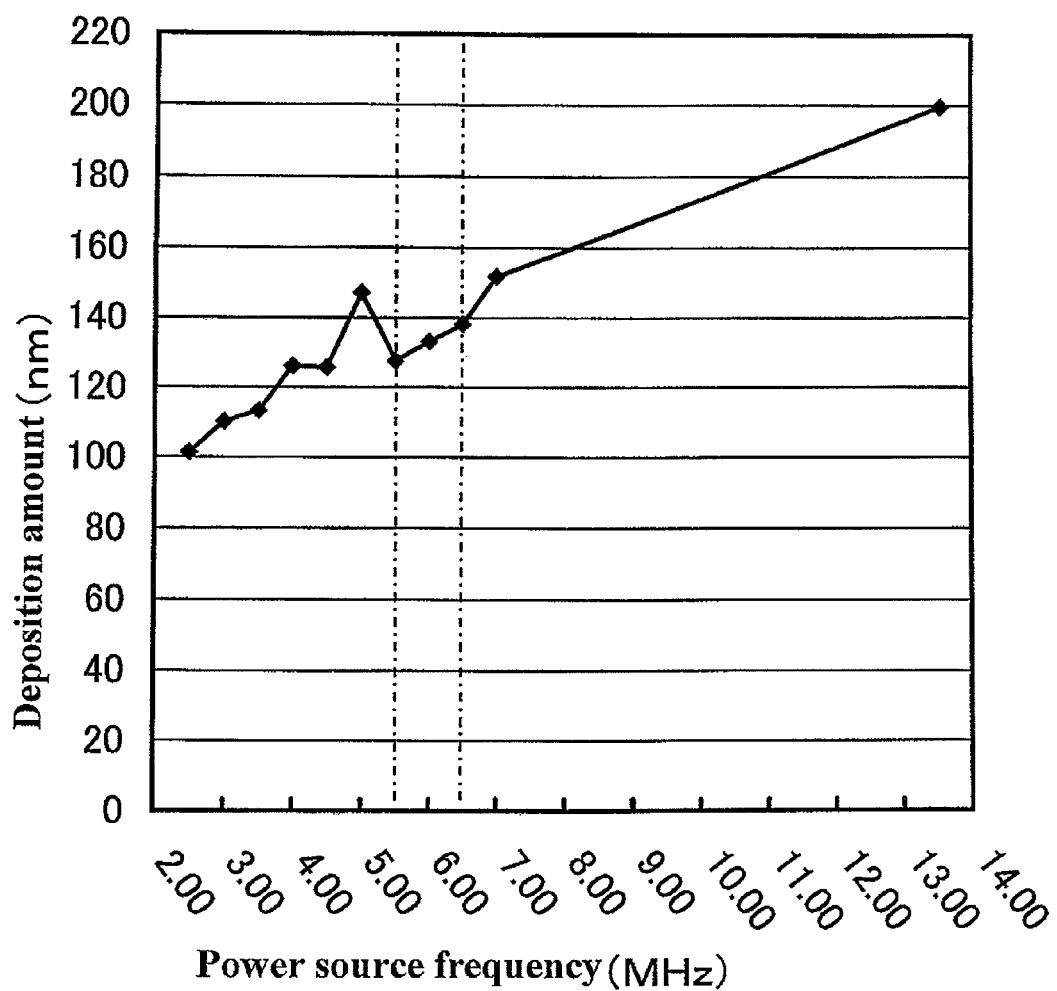
FIG. 6 is a graph showing the relationship between a power source frequency and the amount of deposited carbon dust.
Figure 7:
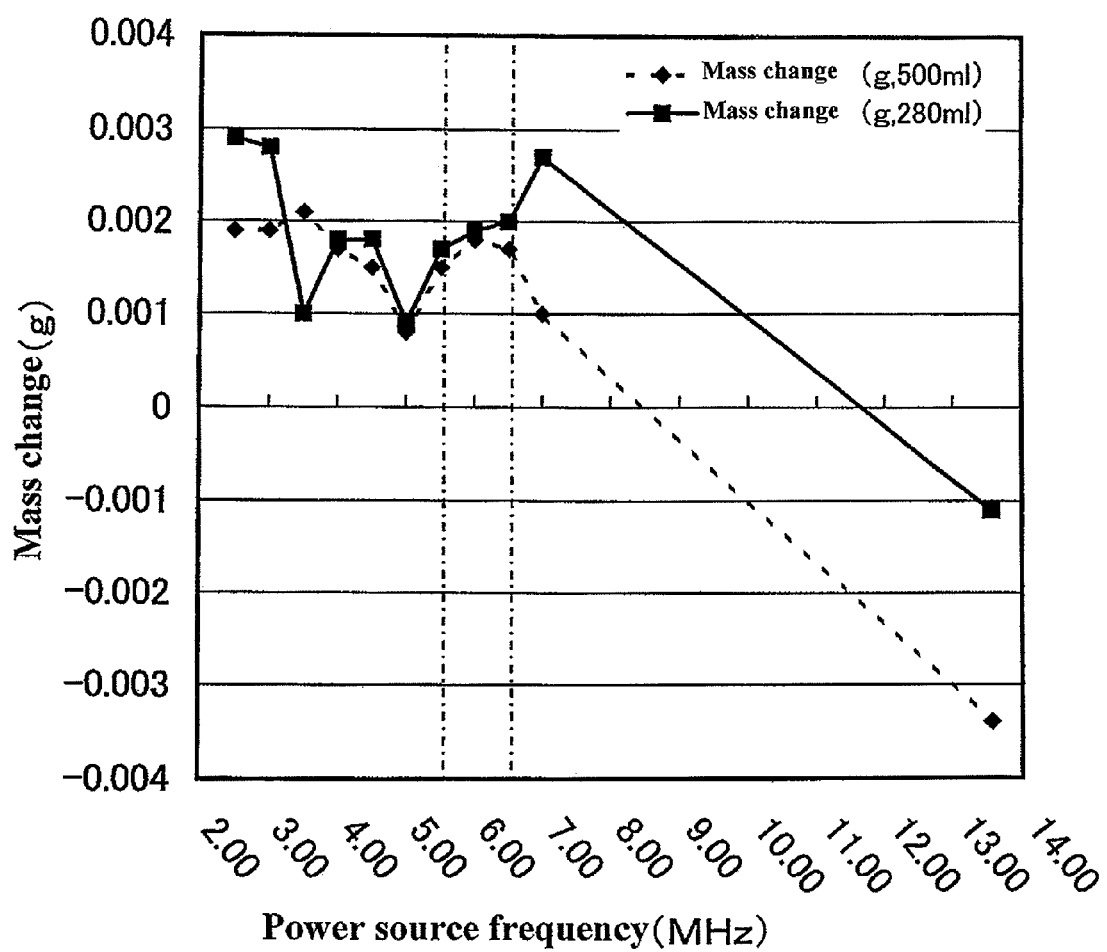
FIG. 7 is a graph showing the relationship between a power source frequency and the mass change of a member placed near the mouth of a bottle.

Table 8 shows the evaluation results of deposition of carbon dust generated when a DLC film was formed on a 500 mL-PET bottle. A silicon wafer was placed on the outer surface of the raw material gas introduction tube located at substantially the center of the exhaust chamber, and then film formation was performed ten times. The amount (nm) of dust deposited in the exhaust chamber was determined at the position F shown in FIG. 1. The time interval between cleaning cycles of the film-forming apparatus is shorter when a larger amount of dust is deposited. FIG. 6 is a graph showing the relationship between the amount of deposited carbon dust and the power source frequency.

bottle and film formation was performed 100 times. The mass change of the member at the position E shown in FIG. 1 was determined and evaluated. A larger increase in the mass of the member indicates that the amount of deposited dust is larger. It can be considered that, in consideration of error factors caused by detachment of the member, there is no significant difference when the power source frequency is in the range of 2.5 to 7 MHz. On the other hand, the mass of the member is significantly reduced when the power source frequency is 13.56 MHz. The reason for this can be considered that the center of plasma was located near the mouth of the bottle and therefore the member was etched. FIG. 7 is a graph showing the relationship between the power source frequency and the

TABLE 8

[500 mL bottle 29 g] 1000 W, 80 sccm, 2 sec, 10 times film-forming

| Frequency (MHz) | (Uncoated) | 2.50 | 3.00 | 3.50 | 4.00 | 4.50 | 5.00 | 5.50 | 6.00 | 6.50 | 7.00 | 13.56 |
|---|---|---|---|---|---|---|---|---|---|---|---|---|---|
| Deposited amount (nm) | — | 101.4 | 110.1 | 113.3 | 126.1 | 125.6 | 147.2 | 127.5 | 133.1 | 138.2 | 151.8 | 199.5 |

(Evaluation of Mass Change of Raw Material Gas Introduction Tube)

mass change of the member placed near the mouth of a 500 mL-PET bottle when a DLC film was formed on the bottle.

TABLE 9

[500 mL bottle 29 g] 1000 W, 80 sccm, 2 sec, 100times film-forming

| Frequency (MHz) | (Uncoated) | 2.50 | 3.00 | 3.50 | 4.00 | 4.50 | 5.00 | 5.50 | 6.00 | 6.50 | 7.00 | 13.56 |
|---|---|---|---|---|---|---|---|---|---|---|---|---|---|
| Mass Change (g, 500 mL) | — | 0.0019 | 0.0019 | 0.0021 | 0.0017 | 0.0015 | 0.0008 | 0.0015 | 0.0018 | 0.0017 | 0.0010 | −0.0034 |

Figure 8:
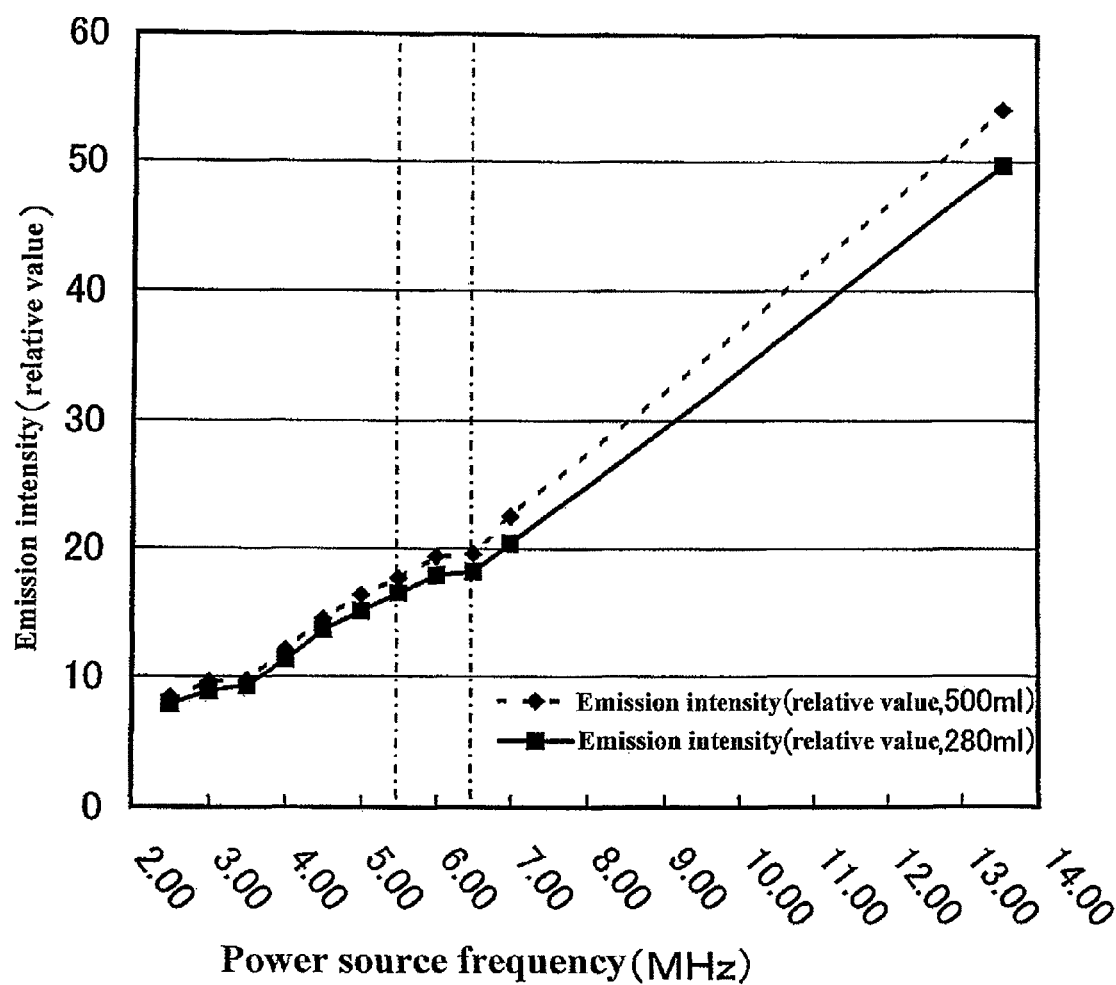
FIG. 8 is a graph showing the relationship between a power source frequency and emission intensity in an exhaust chamber.

Table 10 shows the mass change of the raw material gas introduction tube when a DLC film was formed on a 280 mL-PET bottle. A detachable tubular member made of stainless steel was attached to the outer surface of the raw material gas introduction tube at a position just downstream from the bottle, and film formation was performed 100 times. The mass change of the member at the position E shown in FIG. 1 was determined and evaluated. A larger increase in the mass of the member indicates that the amount of deposited dust is larger. It can be considered that, in consideration of error factors caused by detachment of the member, there is no significant difference when the power source frequency is in the range of 2.5 to 7 MHz. On the other hand, the mass of the member is significantly reduced when the power source frequency is 13.56 MHz. The reason for this can be considered that the center of plasma was located near the mouth of the bottle and therefore the member was etched. FIG. 8 is a graph showing the relationship between the power source frequency and the mass change of the member placed near the mouth of a 280-mL PET bottle when a DLC film was formed on the bottle.

TABLE 10

| | [280 mL bottle 26 g] 1000 W, 90 sccm, 2 sec, 100times film-forming | | | | | | | | | | | |
|---|---|---|---|---|---|---|---|---|---|---|---|---|
| Frequency (MHz) | (Uncoated) | 2.50 | 3.00 | 3.50 | 4.00 | 4.50 | 5.00 | 5.50 | 6.00 | 6.50 | 7.00 | 13.56 |
| Mass Change (g, 280 mL) | — | 0.0029 | 0.0028 | 0.0010 | 0.0018 | 0.0018 | 0.0009 | 0.0017 | 0.0019 | 0.0020 | 0.0027 | −0.0011 |

(Evaluation of Emission Intensity in Exhaust Chamber During Film Formation)

Table 11 shows the intensity of light received by a light sensor placed at the position D shown in FIG. 1 when a DLC film was formed on a 500 mL-PET bottle. It is to be noted that, at the position D, there is an inspection window provided in the outer surface of the exhaust chamber positioned 10 cm away from the center of the gas introduction tube. The intensity of received light has bearing on the emission intensity of plasma. A higher intensity of received light means that plasma is generated at a position closer to the exhaust chamber or plasma is generated in the exhaust chamber. That is, a higher intensity of received light means that the distribution range of plasma in the exhaust chamber is wider and, in addition, the concentration of plasma is higher, which eventually means that the total amount of dust deposited in the exhaust chamber is larger. Likewise, Table 12 shows the intensity of light received by a light sensor placed at the position D shown in FIG. 1 when a DLC film was formed on a 280 mL-PET bottle. FIG. 8 is a graph showing the relationship between the power source frequency and the emission intensity in the exhaust chamber.

TABLE 11

| | [500 mL bottle 29 g] 1000 W, 80 sccm, 2 sec, N = 5 | | | | | | | | | | | |
|---|---|---|---|---|---|---|---|---|---|---|---|---|
| Frequency (MHz) | (Uncoated) | 2.50 | 3.00 | 3.50 | 4.00 | 4.50 | 5.00 | 5.50 | 6.00 | 6.50 | 7.00 | 13.56 |
| Emission Intensity (Relative value, 500 mL) | — | 8.4 | 9.6 | 9.7 | 12.1 | 14.5 | 16.4 | 17.7 | 19.4 | 19.6 | 22.5 | 54.1 |

TABLE 12

| | [280 mL bottle 26 g] 1000 W, 90 sccm, 2 sec, N = 5 | | | | | | | | | | | |
|---|---|---|---|---|---|---|---|---|---|---|---|---|
| Frequency (MHz) | (Uncoated) | 2.50 | 3.00 | 3.50 | 4.00 | 4.50 | 5.00 | 5.50 | 6.00 | 6.50 | 7.00 | 13.56 |
| Emission Intensity (Relative value, 280 mL) | — | 7.9 | 8.9 | 9.3 | 11.3 | 13.6 | 15.1 | 16.5 | 17.9 | 18.2 | 20.4 | 49.7 |

As can be seen from FIG. 8, the emission intensity increases as the power source frequency increases. This indicates that plasma moves upwardly along the main axis of the container. FIG. 7 shows that a portion near the mouth of the bottle is etched when the power source frequency is 13.56 MHz, which is consistent with the results shown in FIG. 8. According to the results shown in FIG. 6, the amount of dust deposited in the exhaust chamber tends to be larger as the power source frequency increases.

On the other hand, as can be seen from FIG. 3, a change in oxygen barrier properties does not show any trend even when the power source frequency increases, and oxygen barrier properties specifically improve when the power source frequency is in the range of 5.5 to 6.5 MHz. Such a specific improvement in oxygen barrier property at 5.5 to 6.5 MHz is achieved irrespective of the difference in capacity between the two types of containers. Further, as can be seen from FIG. 4, the degree of variation in b* value is reduced and the average of b* values is minimized at 5.5 to 6.5 MHz. This indicates that the coloration of the container specifically improves at 5.5 to 6.5 MHz. FIG. 5 also shows a similar tendency, and therefore it has been found that the coloration of the container specifically improves at 5.5 to 6.5 MHz irrespective of the difference in capacity between the two types of containers. Further, as can be seen from Tables 6 and 7, the film adhesiveness is improved by setting the power source frequency to 5.5 MHz or higher. Tables 6 and 7 also show that the adhesive strength of the film is reduced when the power source frequency is below 5.5 MHz. The reason for this can be considered that the intensity of ion bombardment on the inner surface of the PET bottle increases as the frequency decreases so that significant damage is given to the PET polymer chain. On the other hand, if the power source frequency exceeds 6.5 MHz, the center position of plasma is significantly shifted toward the mouth side of the bottle so that the level of oxygen barrier properties becomes lower than its optimum level and variation in coloration occurs.

EXPLANATION OF REFERENCE NUMERALS

1 Lower external electrode
2 Upper external electrode
3 External electrode (film-forming unit)
4 Insulating member
5 Exhaust chamber
6 Cover
7 Film-forming unit
8 Plastic container (PET bottle)
9 Internal electrode (raw material gas supply tube)
9a Gas outlet
10, 37, 38 O-rings
11, 14, 17, 21 Pipes
12, 18, 22 Vacuum valves
13 Mass flow controller
15 Raw material gas generation source
16 Raw material gas supply means
19 Leak source
20 Pressure gage
23 Vacuum pump
24 Exhaust duct
26 Automatic matching device (matching box, M. BOX)
27 Power source for plasma generation
30 Internal space of external electrode (film-forming unit)
31 Internal space of exhaust chamber
32, 32a, 32b Openings
35 Power supply means for plasma generation
100 Film-forming apparatus

The invention claimed is:

1. A method for producing a gas barrier thin film-coated plastic container, comprising the steps of:
    housing a plastic container in an external electrode serving as a film-forming unit;
    placing an internal electrode serving as a raw material gas supply tube in an inside of the plastic container;
    exhausting gas from an inside of the external electrode by activating a vacuum pump;
    blowing a raw material gas into the inside of the plastic container under a pressure which is less than atmospheric pressure; and
    forming a gas barrier thin film on an inner wall surface of the plastic container by generating plasma from the raw material gas, setting a power source frequency of a power source for plasma generation to supply power to the external electrode to be 5.5 to 6.5 MH,
    wherein the gas barrier thin film-coated plastic container has a shoulder and a body, the shoulder and the body each independently has a b* value, the absolute value of the difference between the b* value of the shoulder and the b* value of the body is defined as x, and x satisfies an inequality "x<1.6", and
    wherein (i) the plastic container is a container made of PET and (ii) a DLC film is formed as the gas barrier thin film.

2. The method for producing a gas barrier thin film-coated plastic container according to claim 1, wherein in the step of housing a plastic container in an external electrode, the plastic container is housed in the external electrode in a state that a mouth of the container is directed downward.

3. The method for producing a gas barrier thin film-coated plastic container according to claim 1, wherein in the step of placing an internal electrode serving as a raw material gas supply tube in an inside of the plastic container, when a height of the container is defined as "h" and a bottom of the container is defined as a reference point, the raw material gas supply tube is inserted from the mouth of the container so that a distal end of the raw material gas supply tube is located at a position of ½·h or higher but ⅔·h or lower.

4. The method for producing a gas barrier thin film-coated plastic container according to claim 1, wherein the external electrode has an internal space having a cylindrical shape with bottom.

5. The method for producing a gas barrier thin film-coated plastic container according to claim 1, wherein the plastic container is a container having a capacity of 500 mL or more.

6. The method for producing a gas barrier thin film-coated plastic container according to claim 1, wherein the pressure which is less than atmospheric pressure is 1 to 100 Pa.

7. The method for producing a gas barrier thin film-coated plastic container according claim 1, wherein x satisfies an inequality "x<0.5".

8. The method for producing a gas barrier thin film-coated plastic container according claim 1,
    wherein the average of the b* value of the shoulder and the b* value of the body of the gas barrier thin film-coated plastic container is defined as y, and y satisfies an inequality "y<3.5".

* * * * *